US011209739B2

(12) United States Patent
Povazay

(10) Patent No.: US 11,209,739 B2
(45) Date of Patent: Dec. 28, 2021

(54) METHOD AND APPARATUS FOR ALIGNING TWO OPTICAL SUBSYSTEMS

(71) Applicant: EV Group E. Thallner GmbH, St. Florian am Inn (AT)

(72) Inventor: Boris Povazay, Vienna (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 112 days.

(21) Appl. No.: 16/486,254

(22) PCT Filed: Feb. 22, 2018

(86) PCT No.: PCT/EP2018/054433
§ 371 (c)(1),
(2) Date: Aug. 15, 2019

(87) PCT Pub. No.: WO2018/166772
PCT Pub. Date: Sep. 20, 2018

(65) Prior Publication Data
US 2020/0174383 A1 Jun. 4, 2020

(30) Foreign Application Priority Data
Mar. 16, 2017 (DE) .......................... 102017105697.1

(51) Int. Cl.
*G03F 9/00* (2006.01)
*G03F 7/20* (2006.01)
(Continued)

(52) U.S. Cl.
CPC ........ *G03F 9/7088* (2013.01); *G03F 7/70516* (2013.01); *G03F 9/7007* (2013.01);
(Continued)

(58) Field of Classification Search
CPC .. G03F 7/70516; G03F 7/70591; G03F 7/706; G03F 9/7003; G03F 9/7007;
(Continued)

(56) References Cited

U.S. PATENT DOCUMENTS 3,442,583 A * 5/1969 Rottmann ............... G01B 11/26
353/34
3,752,589 A * 8/1973 Kobayashi .............. H01L 21/00
356/401

(Continued)

FOREIGN PATENT DOCUMENTS

CN 102944978 B 8/2014
DE 69012874 T2 4/1995
(Continued)

OTHER PUBLICATIONS

International Search Report from corresponding International Patent Application No. PCT/EP2018/054433, dated Jun. 20, 2018.

*Primary Examiner* — Gordon J Stock, Jr.
(74) *Attorney, Agent, or Firm* — Kusner & Jaffe

(57) ABSTRACT

A method and a device for aligning two lenses, wherein the method is directed to aligning first and second optical partial systems of an optical system, which are arranged so as to be located opposite to one another. The method includes the steps of: projecting alignment marks into a first image plane of the first optical partial system, projecting the alignment marks from the first image plane onto a sensitive surface of the second optical partial system, and aligning the optical partial systems relative to one another, such that projections of the alignment marks in a depth of field of the sensitive surface are imaged at ideal positions.

23 Claims, 9 Drawing Sheets

(51) Int. Cl.
  *H01L 21/68* (2006.01)
  *H01L 23/544* (2006.01)
  *H01L 21/67* (2006.01)
  *H01L 21/20* (2006.01)

(52) U.S. Cl.
  CPC .......... *G03F 9/7046* (2013.01); *H01L 21/681* (2013.01); *H01L 23/544* (2013.01); *H01L 21/2007* (2013.01); *H01L 21/67259* (2013.01)

(58) Field of Classification Search
  CPC .... G03F 9/7019; G03F 9/7073; G03F 9/7088; G03F 9/7076; G03F 9/7084; G03F 9/7069; G03F 9/7046; G03F 7/2022; G03F 7/2032; G03F 7/70258; G03F 7/70275; G03F 7/70375; G03F 7/70466; G03F 7/70483; G03F 7/7085; G03F 7/70991; G03F 9/00; G03F 2009/005; G01M 11/0221; G01M 11/02; G01M 11/0207; G01B 11/14; G01B 11/26; G01B 11/27; H01L 22/10; H01L 22/20; H01L 21/02016; H01L 21/2007; H01L 21/187; H01L 21/67092; H01L 21/67242; H01L 21/67259; H01L 21/68; H01L 21/681; H01L 21/682; H01L 21/68771; H01L 21/68778; H01L 23/544
  USPC ........ 356/124, 127, 153, 399–401, 614–620; 355/53, 55, 77; 430/22, 30; 382/151; 438/401; 257/797
  See application file for complete search history.

(56) References Cited

U.S. PATENT DOCUMENTS

| | | | | |
|---|---|---|---|---|
| 3,950,094 A * | 4/1976 | Kano | .................... | G03F 9/7003 355/45 |
| 4,417,123 A * | 11/1983 | Keller | ....................... | H01J 9/00 219/121.68 |
| 4,723,846 A * | 2/1988 | Uehara | .................... | G03F 9/70 356/401 |
| 5,004,348 A | 4/1991 | Magome | | |
| 5,100,237 A | 3/1992 | Wittekoek et al. | | |
| 5,160,957 A | 11/1992 | Ina et al. | | |
| 5,260,771 A * | 11/1993 | Komoriya | ................. | G03F 9/70 356/401 |
| 5,309,197 A * | 5/1994 | Mori | .................... | G03F 9/7088 355/53 |
| 5,767,523 A * | 6/1998 | McCullough | ....... | G03F 7/70591 250/548 |
| 5,850,279 A * | 12/1998 | Nara | .................... | G03F 7/70275 355/53 |
| 5,940,528 A | 8/1999 | Tanaka et al. | | |
| 6,214,692 B1 | 4/2001 | Thallner | | |
| 6,222,198 B1 * | 4/2001 | Brown | .................. | G03F 9/7003 250/548 |
| 6,314,543 B1 * | 11/2001 | Yamaguchi | ............. | G06F 30/39 716/54 |
| 7,251,883 B2 * | 8/2007 | Nakamura | ........... | B41J 2/14024 29/834 |
| 8,994,916 B2 * | 3/2015 | Mei | ....................... | G03F 7/2032 355/26 |
| 9,001,305 B2 * | 4/2015 | Mei | ..................... | G03F 7/70275 355/53 |
| 9,418,882 B2 * | 8/2016 | Thallner | ........... | H01L 21/67092 |
| 9,851,645 B2 * | 12/2017 | Wagenleitner | .......... | H01L 22/26 |
| 10,954,122 B2 * | 3/2021 | Wagenleitner | .... | H01L 21/67092 |
| 2006/0055904 A1 * | 3/2006 | Baselmans | ........... | G03F 9/7076 355/55 |
| 2007/0252994 A1 | 11/2007 | Bijnen et al. | | |
| 2008/0292177 A1 | 11/2008 | Sheets et al. | | |
| 2012/0031557 A1 * | 2/2012 | Kinouchi | ............ | B81C 1/00357 156/324.4 |
| 2012/0255365 A1 * | 10/2012 | Wimplinger | .......... | H01L 21/681 73/760 |
| 2013/0044300 A1 * | 2/2013 | Mei | ..................... | G03F 7/70425 355/52 |
| 2013/0335504 A1 * | 12/2013 | Sandstrom | ................. | B41J 2/47 347/246 |
| 2014/0035171 A1 * | 2/2014 | Yang | ..................... | H01L 23/544 257/797 |
| 2016/0079102 A1 * | 3/2016 | Fukayama | ............. | G01B 11/26 340/686.2 |
| 2016/0148826 A1 | 5/2016 | Thallner | | |
| 2016/0252753 A1 * | 9/2016 | Deng | .................. | G03F 7/70775 29/281.5 |
| 2019/0378799 A1 * | 12/2019 | Wagenleitner | ........ | H01L 23/544 |
| 2020/0055729 A1 * | 2/2020 | Wagenleitner | .... | H01L 21/67092 |

FOREIGN PATENT DOCUMENTS

| | | |
|---|---|---|
| DE | 102005013755 B4 | 3/2010 |
| DE | 102013004738 A1 | 10/2014 |
| JP | 2003-303865 A | 10/2003 |
| WO | WO 2011/042093 A1 | 4/2011 |
| WO | WO 2014/202106 A1 | 12/2014 |
| WO | WO 2015/082020 A1 | 6/2015 |

* cited by examiner

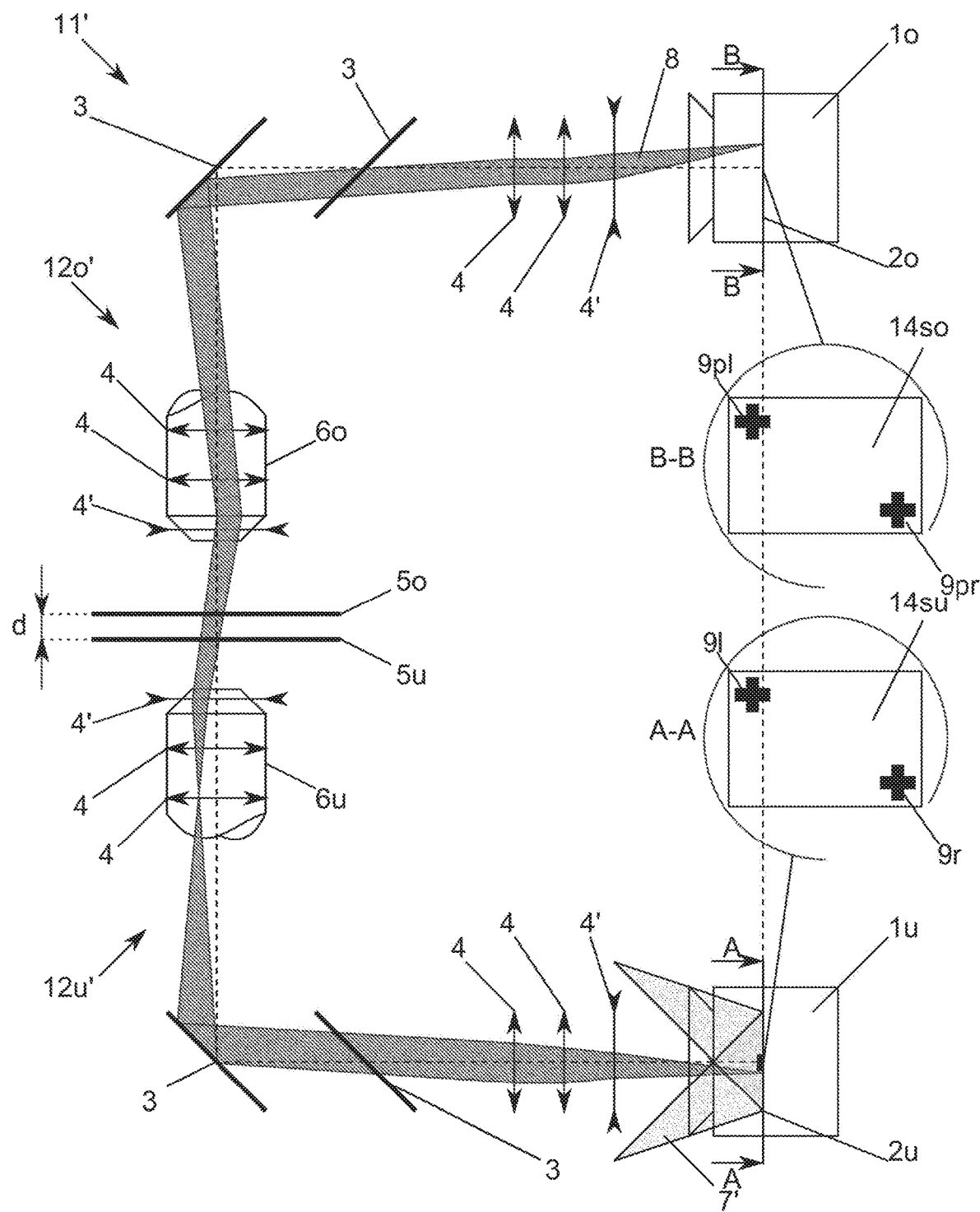

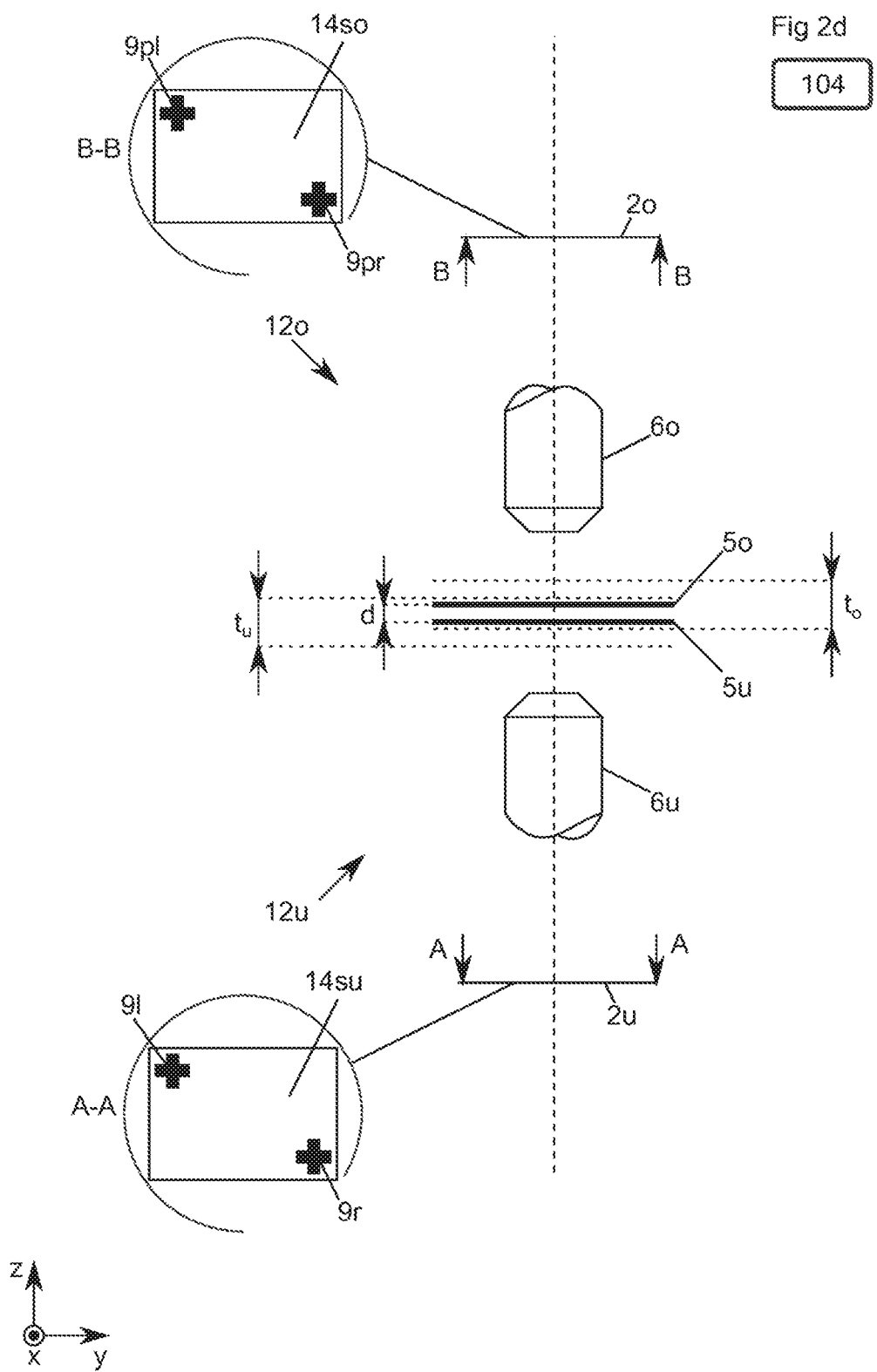

METHOD AND APPARATUS FOR ALIGNING TWO OPTICAL SUBSYSTEMS

FIELD OF THE INVENTION

The present invention relates generally to substrate alignment, and more particularly to a method and system for aligning two optical partial systems of an optical system.

BACKGROUND OF THE INVENTION

In the semiconductor industry, aligners are used to align substrates, in particular wafers, relative to one another, so that they are connected to one another in a further process step. The connection process is called bonding. The alignment of the substrates relative to one another occurs by means of alignment marks, which are located on the surfaces of the substrates. The alignment marks on opposite sides of the opposite substrates are in particular complementary to one another.

The alignment processes, in the case of which the alignment marks are located at the substrate surfaces, which are to be bonded, are identified as face-to-face alignments. If the substrates are not transparent for the electromagnetic radiation, which is to be measured, methods need to be developed to measure the marks, before the substrate approach one another.

A method, which has been practiced for a very long time, was to insert a camera, which was removed prior to the approach, between the substrates. This was associated with a plurality of disadvantages. First of all, the camera resulted in a particle contamination on at least the lower substrate and, secondly, the distance between the substrates had to be chosen to be relatively large, in order to place the camera between both substrates. The large distance had the disadvantage that the travelling distance in response to the approach of the two substrates, after the camera had been removed, was very large and that the substrates shifted laterally in response to the mutual approach, and thus differed from their previous, optimal alignment relative to one another.

The aligner of publication U.S. Pat. No. 6,214,692B1 represents an improvement of the face-to-face alignment. In the disclosed aligner, the use of a camera, which is to be inserted between the substrates, was completely forgone. Instead, two lens groups, each comprising two lenses, which are located opposite to one another, were used, to create a system comprising two reference points, in relation to which the substrates are mutually positioned. The reference points were the points of intersection of the optical axes of two lenses, which are located opposite to one another. The corresponding process for the calibration of such lenses has been disclosed and described extensively in FIGS. 2c and 2e of publication WO2014202106A1 or in FIGS. 5a and 5b of publication WO2015082020A1.

The problem with the prior art, in particular the calibration method according to FIGS. 2c and 2e of publication WO2014202106A1 or according to FIGS. 5a and 5b of publication WO2015082020A1 is that a calibration substrate is required, in relation to which a calibration of the optical axes of the lenses is performed. The upper and the lower lenses are calibrated to an alignment mark in the, in particular transparent, substrate. The left optical axes are thus adjusted to a left focal point, and the right optical axes are adjusted to a right focal point.

SUMMARY OF THE INVENTION

It is an object of the present invention to provide a method and a system which overcomes disadvantages of the prior art and by means of which in particular two lenses can be aligned or calibrated, respectively, relative to each other in a simplified manner. This object is solved by means of the features of the independent claims. Advantageous further developments of the invention are specified in the subclaims. All combinations from at least two features specified in the description, the claims and/or the figures, also fall within the scope of the invention. In the case of specified value ranges, values within the mentioned boundaries shall also be considered as being disclosed as threshold values and shall be capable of being claimed in any combination.

The invention describes in particular, how the two image planes of the two lenses, which are located opposite to one another, and/or the optical axes of the two lenses can be in alignment relative to one another.

Advantageously, the use of a calibration substrate according to publication WO2014202106A1 can be forgone.

According to the invention, provision is made for a method for the alignment of two optical partial systems of an optical system, which are arranged so as to be located opposite to one another, in particular on top of one another, comprising the following steps:
projecting alignment marks into an image plane of the first, in particular lower, optical partial system,
projecting the alignment marks from the first image plane onto a sensitive surface of the second, in particular upper, optical partial system,
aligning the optical partial systems relative to one another, so that projections of the alignment marks in a depth of field of the sensitive surface are imaged at ideal positions.

The depths of focus and/or the depths of field of all optical elements, in particular of the lenses, are between 1 nm and 10 mm, preferably between 10 nm and 1 mm, more preferably between 50 nm and 500 µm, most preferably between 500 nm and 250 µm, most preferably of all between 1 µm and 100 µm.

In a preferred embodiment, provision is made for light for illuminating the alignment marks to be coupled into the first and/or second optical partial system via at least one light source, in particular a lamp, preferably a halogen lamp, more preferably an LED, most preferably a laser light source, and at least one mirror. Advantageously, a particularly bright illumination of the alignment marks can be attained by means of such an external light source.

According to another preferred embodiment, provision is made for ambient light for illuminating the alignments marks to be coupled in at least one location of the optical partial systems, in particular on a first camera and/or on a mirror, wherein a shielding of the optical partial systems is preferably not installed. Advantageously, it is thus possible to illuminate the alignment marks without additional external light sources.

According to another particularly preferred embodiment, provision is made for the alignment marks to be projected onto a first sensitive surface of a first camera chip of a first camera by means of an alignment mark projection system, wherein the alignment marks in particular comprise an LED field and/or are embodied as masks. Advantageously, it is thus not required that the alignment marks need to be introduced into the camera chip.

According to another preferred embodiment, provision is made for the optical partial systems to comprise two lenses, which are arranged opposite to one another, the image planes and/or optical axes of which are aligned relative to one another.

Advantageously, a particularly efficient alignment of the optical partial systems or of the lenses, respectively, is thus possible.

According to another preferred embodiment, provision is made for at least the lenses to be part of a system for aligning substrates, in particular wafers. Advantageously, a significant improvement of a system for aligning substrates is possible hereby.

According to another preferred embodiment, the method according to the invention has the following sequence:
- arranging alignment marks in the vicinity and/or on a first sensitive surface of a first camera chip of a first camera and/or projecting alignment marks onto a first sensitive surface of a first camera chip of a first camera,
- projecting the alignment marks from the first camera chip via the first optical partial system into the first image plane, wherein the first optical partial system has the first lens, wherein the first image plane is arranged between the lenses,
- projecting the alignment marks from the first image plane via the second optical partial system onto the second sensitive surface of a second camera chip of a second camera, wherein the second optical partial system has the second lens,
- in particular aligning the lenses relative to one another, so that projected alignment marks of the alignment marks are imaged in focus on the second camera, and positions of the projected alignment marks correspond with desired and/or ideal positions.

According to another preferred embodiment, provision is made for the lenses for the alignment to be moved in a translational and/or rotational manner relative to one another. Advantageously, a particularly exact alignment is thus possible.

According to another preferred embodiment, provision is made for the lenses for the alignment to be approached in such a way that the first image plane of the first lens is located in a depth of field of the second object plane of the second lens. Advantageously, a particularly focused imaging of the alignment marks is thus possible.

According to another preferred embodiment, provision is made for the alignment marks to be attached directly to a first sensitive surface of a first camera chip of a first camera, in particular by means of lithographic methods. Advantageously, a particularly efficient production of the alignment marks is thus possible.

According to another preferred embodiment, provision is made for the alignment marks to be attached directly to a first sensitive surface of a first camera chip, wherein the alignments marks have an accumulation of non-functional pixels, in particular having a cross shape. Advantageously, a particularly simple production of the alignment marks is thus possible.

According to another preferred embodiment, provision is made for the alignment marks to be attached to a separate marking plate in a first camera chip of a first camera, wherein the distance between the alignment marks and a first sensitive surface of the first camera chip is smaller than 1 mm, preferably smaller than 100 µm, more preferably smaller than 10 µm, most preferably smaller than 1 µm, most preferably of all smaller than 0.1 µm, Advantageously, a processing of the camera chip is thus not required in order to produce the alignment marks.

A further subject matter of the invention at hand relates to a system for aligning two optical partial systems, which are located opposite to one another, in particular on top of one another, in particular by means of a method according to one of the preceding patent claims, having:
- a first camera comprising a first camera chip for projecting alignment marks in an image plane of the first, in particular lower optical partial system,
- means for projecting the alignment marks from the first image plane onto a sensitive surface of the second, in particular upper optical partial system,
- means for aligning the optical partial systems relative to one another, so that projections of the alignment marks can be imaged at ideal positions in a depth of field of the sensitive surface.

The embodiments with regard to the method also refer to the system according to the invention.

A further subject matter of the invention at hand relates to a camera chip comprising alignment marks in the vicinity and/or on its sensitive surface, in particular for a system and/or method according to one of the preceding patent claims. The statements relating to the method also refer to the camera chip according to the invention.

The Optical System

The embodiment according to the invention relates to an optical system comprising at least one first, lower optical partial system, and a second, upper optical partial system. In consideration of the preferred construction, all entities will only be identified by the words "top" and "bottom" in the further course of the present disclosure. The lower optical partial system and the upper optical partial system have at least one optical element, in particular a plurality of optical elements. The optical elements are in particular mirrors, in particular
    plane mirrors
    convex mirrors
    concave mirrors
lenses
    convex lenses
        biconvex
        planar convex
        concave convex
    concave lenses
        biconcave
        planar concave
        convex concave
    Fresnel lenses
prisms
diffraction elements
    diffraction grating
etc.

The mirrors are preferably cold light mirrors (hereinafter also referred to as cold mirrors), which filter out infrared light from the light, which is coupled in, in order to prevent an unnecessary and unwanted heating of the optical system. In particular, light of the wavelength of between 1000 µm and 0.8 µm, preferably between 750 µm and 0.8 µm, more preferably between 500 µm and 0.8 µm, most preferably between 100 µm and 0.8 µm, most preferably of all between 50 µm and 0.8 µm is filtered.

The embodiment according to the invention will be described in an exemplary manner such that the objects, which are to be projected, in particular alignment marks, are projected from a lower camera, in particular from the sensitive surface thereof, onto an upper camera chip, in particular the sensitive surface thereof. It is also conceivable that the alignment marks are projected from an upper camera chip, in particular the sensitive surface thereof, onto a lower camera chip, in particular the sensitive surface thereof. For the sake of completeness, the extreme case shall also be mentioned that alignment marks are located on both camera chips, in particular the sensitive surfaces thereof, and are in each case mutually projected onto the respective opposite camera chip or the sensitive surface thereof, respectively. In the further course of the description, it will be shown that only one projection direction is relevant in order to create the effect according to the invention.

In the further course of the present disclosure, only the exemplary case will be discussed, in the case of which lower alignment marks are projected onto the sensitive surface of an upper camera chip.

The embodiment according to the invention requires a lower camera chip, which has alignment marks in the vicinity of the sensitive surface thereof, preferably directly on the sensitive surface. The alignment marks can either exist in reality or they are only alignment marks, which are projected onto the lower camera chip. In the latter case, they are projected onto the sensitive surface of the lower camera chip by means of an alignment mark projection system. This embodiment is the most preferred of all embodiments, because camera chips are not required, which have corresponding alignment marks, but because alignment marks can be projected onto any commercially available chip.

In a first embodiment according to the invention, the alignment marks are produced directly on the lower camera chip. In particular, the alignment marks are located on the sensitive surface of the lower camera chip. The production of the alignment marks on the lower camera chip should preferably be carried out by the chip manufacturer and can hardly be carried out by customers, who purchase such a chip. It would be conceivable to disassembly the acquired lower camera chip, so that the sensitive surface of the lower camera chip is exposed completely. With the help of well-known lithographic methods, corresponding lower alignment marks could then be attached and the disassembled lower camera chip could then be assembled again. A removal of the protective glass for the sensitive surface, however, is frequently associated with a destruction of the camera chip, in particular with the sensitive surface thereof, and can thus usually not be carried out in a destruction-free manner.

In a second, preferred embodiment according to the invention, the lower alignment marks are not produced directly on the lower camera chip, but on a carrier (also referred to as marking plate), which can be mounted via fixing means above the encapsulated lower camera chip. It is important to ensure hereby that the lower alignment marks are located as closely as possible on the surface of the sensitive area of the lower camera chip, so that they are definitely located in the depth of field of the recording lower camera, which is located on the opposite side of the optical path.

The distance between the alignment marks and the sensitive surface should be smaller than 1 mm, preferably smaller than 100 μm, more preferably smaller than 10 μm, most preferably smaller than 1 μm, most preferably of all smaller than 0.1 μm. For the most part, encapsulated camera chips can be disassembled relatively easily, except for the last cover plate of the photosensitive region, so that a positioning of a carrier according to the invention with alignment marks close to the photosensitive surface can be accomplished.

In a third, less preferred embodiment according to the invention, the lower alignment marks are projected onto the photosensitive surface of a lower camera chip. This has the advantage that any of the lower camera chips can be provided with lower alignment marks. So that the lower alignments marks, which are projected onto the lower camera chip, are located at the ideal positions, a calibration of the lower alignment marks, which are projected by means of the alignment mark projection system, needs to be performed onto the lower camera chip, before these projected, lower alignment marks can be projected onto the upper camera chip across the optical path of the optical system, so as to align the two camera chips relative to one another.

It is now the essential aspect according to the invention to project the lower alignment marks of the lower camera chip onto the photosensitive surface of the upper camera chip, which is located opposite to the lower camera chip in the optical path. To attain a correct, focused projection of the lower alignment marks on the upper camera chip, thus projected in focus, upper alignment marks, the optical elements, in particular the lower optical partial system and the upper optical partial system need to be calibrated relative to one another. The end of the calibration is determined in that the projected, upper alignment marks are located at the ideal positions on the upper camera chip.

Each of the two optical partial systems has an object plane and an image plane, which are conjugated relative to one another. Conjugated planes are understood to be planes, which are mathematically connected to one another via the mapping rule of the Fourier transformation. Two planes are conjugated relative to one another, when they are perpendicular to the optical axes of an optical path and image objects from the object space into the image space and vice versa.

Due to the fact that we are considering the projection of lower alignment marks of the lower camera chip onto the upper camera chip in an exemplary manner, the lower photosensitive surface of the lower camera chip is the first object plane.

The actual or projected alignment marks of the alignment mark projection system on the lower photosensitive surface of the lower camera chip are preferably located in the object plane. In general, the actual alignment marks only need to be located in the depth of field around the object plane.

The lower optical partial system now projects these alignment marks into its image plane. This image plane is a first, lower image plane. This lower image plane is definitely located between the two lenses, the optical paths of which need to be calibrated relative to one another. The second optical partial system also has an optical plane between the lenses. This optical plane, however, now acts as object plane and has the task of projecting the alignment marks of the photosensitive surface of the lower camera chip, which is projected onto the lower image plane, onto the second, upper image plane of the upper optical partial system. The upper image plane thus coincides with the sensitive surface of the upper camera chip. So that the image of the alignment marks, which is projected into the lower image plane, is also imaged onto the upper image plane with as little loss as possible and in particular so as to be focused, lower image plane and upper object plane need to be congruent, if possible.

Due to the fact that the lower image plane of the lower optical partial system and the upper object plane of the upper optical partial system are generally not congruent or are not even located in the depth of field of the respective other optical plane, a change of the optical partial systems, in particular of the optical elements, is necessary. This change in particular requires a translational and/or rotational adaptation of the optical elements of the lower and/or upper optical partial system, in particular a translational and/or rotational change of the lenses. It is the goal of the embodiment according to the invention to not only project the lower alignment marks of the lower camera chip onto the photosensitive surface of the upper camera chip in a focused manner, but to also adapt the optical elements in the optical system, until the positions of the projected alignment marks correspond to the theoretically wanted, ideal positions. Preferably, the same camera chips are used in the lower and upper optical partial system. The positions of the ideally projected alignment marks are thus the same detector coordinates, which also have the alignment marks, which are to be projected, on the lower camera chip. The optical systems are thus changed and adapted in such a way that the marks are located within a freely chosen tolerance range with regard to the ideal position.

Process

The process according to the invention can in particular be used to calibrate the lenses in the systems of publications U.S. Pat. No. 6,214,692B1, WO2011042093A1, WO2014202106A1 and WO2015082020A1. The general nature of the process, however, is not limited in this way. In general, the process according to the invention can be used for the in particular fully automatic calibration of any two lenses.

In a first process step according to the invention, the two optical planes are approached relative to one another, so that the lower image plane is located in the depth of field of the upper object plane or the upper object plane is located in the depth of field of the lower image plane, respectively. In the first process step according to the invention, the projected left, upper alignment mark or the right, upper alignment mark is not yet necessarily focused. In particular, both upper alignment marks also do not yet need to be located in the field of view of the upper camera. The fields of view of the cameras are between 10 μm and 50 mm, preferably between 50 μm and 25 mm, more preferably between 100 μm and 15 mm, most preferably between 250 μm and 10 mm, most preferably of all between 300 μm and 5 mm.

In a second process step according to the invention, a change of the lower and/or upper optical partial system takes place, so that at least both projected alignment marks are located in the field of view of the upper camera, A change of the lower and/or upper optical partial system is in particular understood as the translational and/or rotational and/or functional change of at least one optical element in the lower and/or upper optical partial system. In particular a translational and/or rotational movement of the lower and/or upper lens is understood thereby.

In a third process step according to the invention, a wedge error compensation occurs between the two optical planes, or a reduction of the angle between the optical axes, respectively. The wedge error compensation is performed out in such a way that at least one optical element is changed in the lower and/or upper optical partial system in such a way that it results in a reduction of the inclination occurs between the two optical axes of the two optical partial systems. The wedge error is in particular reduced by the rotation of at least one of the two lenses.

In a fourth process step according to the invention, after all alignment marks are located in the depth of field and in the field of view of the upper camera chip, and the wedge error has been largely reduced, a fine adjustment occurs between the alignment marks, in that the projected alignment marks at the upper camera chip are brought into the position of the ideal positions. This occurs in particular by means of translational shifting and/or rotation of the lower and/or upper lens.

In particular, the process steps one to four according to the invention can be performed in any order and/or simultaneously. An in particular simultaneous performance of all process steps according to the invention is ensured by means of a corresponding firmware and/or hardware and/or software, which can calibrate the two optical partial systems relative to one another, in particular fully automatically, by means of an algorithm. The calibration can in particular occur automatically by means of a control loop.

The process steps one to three according to the invention are in particular process steps of a rough calibration, which need to be performed completely only rarely, in particular after a maintenance, a construction or a change of position of the embodiment according to the invention. After a rough calibration has been performed, only a fine calibration according to process step four is necessary for the most part for a longer period of time.

The optical system, which is calibrated according to the invention, can then be used to measure surfaces. The system is in particular suitable to align two substrates relative to one another. In a particularly preferred embodiment, the system is used for the face-to-face alignment of two substrates relative to one another.

A further option for the use of the optical system, which is calibrated according to the invention, is the measuring of the upper and lower side of a substrate or substrate stack. In this specific case, the optical system is used as part of a measuring system (metrology tool). The simultaneous measuring of the upper and lower side of a substrate or substrate stack is mostly carried out in order to measure a horizontal distance between two surface features.

Camera Chip

The camera chip is in particular embodied as surface detector. The camera chip is preferably a CCD detector, a CMOS detector, an analog detector, a four-quadrant detector or a so-called position sensing device (PSD). The camera chip in particular has a read frequency of between 1 Hz and 1 MHz, preferably between 10 Hz and 100.000 Hz, more preferably between 20 Hz and 10.000 Hz, most preferably between 30 Hz and 1.000 Hz, most preferably of all between 40 and 100 Hz. Read frequency is hereby understood to be the number of the full interference images, which the camera chip can read per second.

The horizontal pixel resolution of the camera chip is in particular more than 10 pixels/cm, preferably more than 100 pixels/cm, more preferably more than 1000 pixels/cm, most preferably more than 10000 pixels/cm, most preferably of all more than 100000 pixels/cm.

The vertical pixel resolution of the camera chip is in particular more than 10 pixels/cm, preferably more than 100 pixels/cm, more preferably more than 1000 pixels/cm, most preferably more than 10000 pixels/cm, most preferably of all more than 100000 pixels/cm.

The distance between two pixels is between 0.1 μm and 100 μm, preferably between 0.5 μm and 50 μm, more preferably between 1 μm and 25 μm, most preferably between 2.5 μm and 10 μm, most preferably of all 5 μm.

In a particular embodiment according to the invention, the optical system can have two cameras comprising two different camera chips. The camera chips could for example differ in size. In this case, even the use of alignment marks can be forgone. The calibration according to the invention then occurs in such a way that the contours of a camera chip are projected onto the respective other camera chip. By means of optical elements, which provide for a scaling, the camera chip, which is to be projected, can be imaged onto the surface of the other camera chip in a congruent manner.

In general, an affine transformation of the one camera chip onto the other camera chip thus occurs, which is characterized in that the surfaces of the camera chips are congruent. Such an affine transformation can always be attained by means of the mathematical operations shifting, rotation and scaling, which is always converted real-physically in the optical system by means of the optical elements. The two chips of different sizes preferably have the same pixel size and/or the same pixel resolution, i.e. the same distance between the pixels. This embodiment according to the invention is particularly preferred, because not even alignment marks need to be projected onto the chip surface here, or the contours of the camera chips can be considered to be alignment marks, respectively. The chip, in particular its contour itself, is the alignment mark, which leads to a further cost savings when constructing the device according to the invention, because an alignment mark projection system is not required. The device according to the invention thus furthermore also becomes completely independent from the chip manufacturer, because the latter does not need to provide any alignment marks, while the contour of a chip, however, is an intrinsic part of its construction. If the contour of a chip is used as alignment mark, the chip is to be captured as centered as possible by means of the optical system, i.e. the center of gravity of the chip should be located as closely as possible to the optical axis. In particular, the distance between the optical axis and the center of gravity of the chip is smaller than 1 mm, preferably smaller than 0.5 mm, more preferably smaller than 0.1 mm, most preferably smaller than 0.01 mm, most preferably of all smaller than 0.001 mm.

For all mentioned embodiments according to the invention of the calibration of two optical partial system relative to one another, it applies that, in practice, a perfect calibration is either not possible, or is not wanted, in particular for economical reasons. An extremely accurate calibration can take a significant amount of time, during which further processes, which are performed by means of the system, cannot take place. In general, a calibration process can be terminated, as soon as a determined threshold value has been reached or exceeded, respectively. In a further expansion according to the invention, it is conceivable that the coordinates of the two alignment marks, which are not calibrated perfectly relative to one another, are stored in relation to a common coordinate system. This common coordinate system can for example be the lower detector coordinate system or the upper detector coordinate system. It is also conceivable that the coordinates of the two alignment marks, which are not calibrated perfectly relative to one another, are stored in any other coordinate system. Due to the perfect superimposition of the alignment marks, which does not materialize and/or which is not wanted, the alignment marks are thus generally still slightly shifted relative to one another and/or rotated relative to one another after the calibration process. This shift and/or rotation relative to one another can be measured, stored, and used in a later process, in particular an alignment process of two substrates relative to one another (alignment), in order to perform a correction of the determined coordinates of alignment marks on the substrates.

Further advantages, features and details of the invention follow from the description below of preferred exemplary embodiments as well as from the drawings.

BRIEF DESCRIPTION OF THE DRAWINGS

FIG. 1b shows a schematic, not to scale sketch of a second optical system according to the invention comprising a second light coupling, FIG. 2d shows a schematic, not to scale simplified sketch of a fourth process step according the invention.

Identical components or components comprising the identical function are identified with identical reference numerals in the, figures.

DETAILED DESCRIPTION OF THE INVENTION

In the illustrated figures, all optical paths 7, 7', 8 are only illustrated schematically and are not to be understood as paths, which strictly follow the laws of optics. The optical paths 7, 7', 8 and the optical partial systems $12u$, $12u'$, $12u''$, $12o$, $12o'$, $12o''$ are furthermore illustrated in such a way that no mutual, mirror-imaged projection of camera chips $2u$, $2o$ occurs. In particular the understanding of the congruent detector coordinate systems is made easier thereby. It is clear to the person of skill in the art that in an actual embodiment, the mutual imaging of the camera chips $2u$, $2o$ on one another can occur in a mirror-inverted manner and preferably also does occur in a mirror-inverted manner.

Figure 1A:
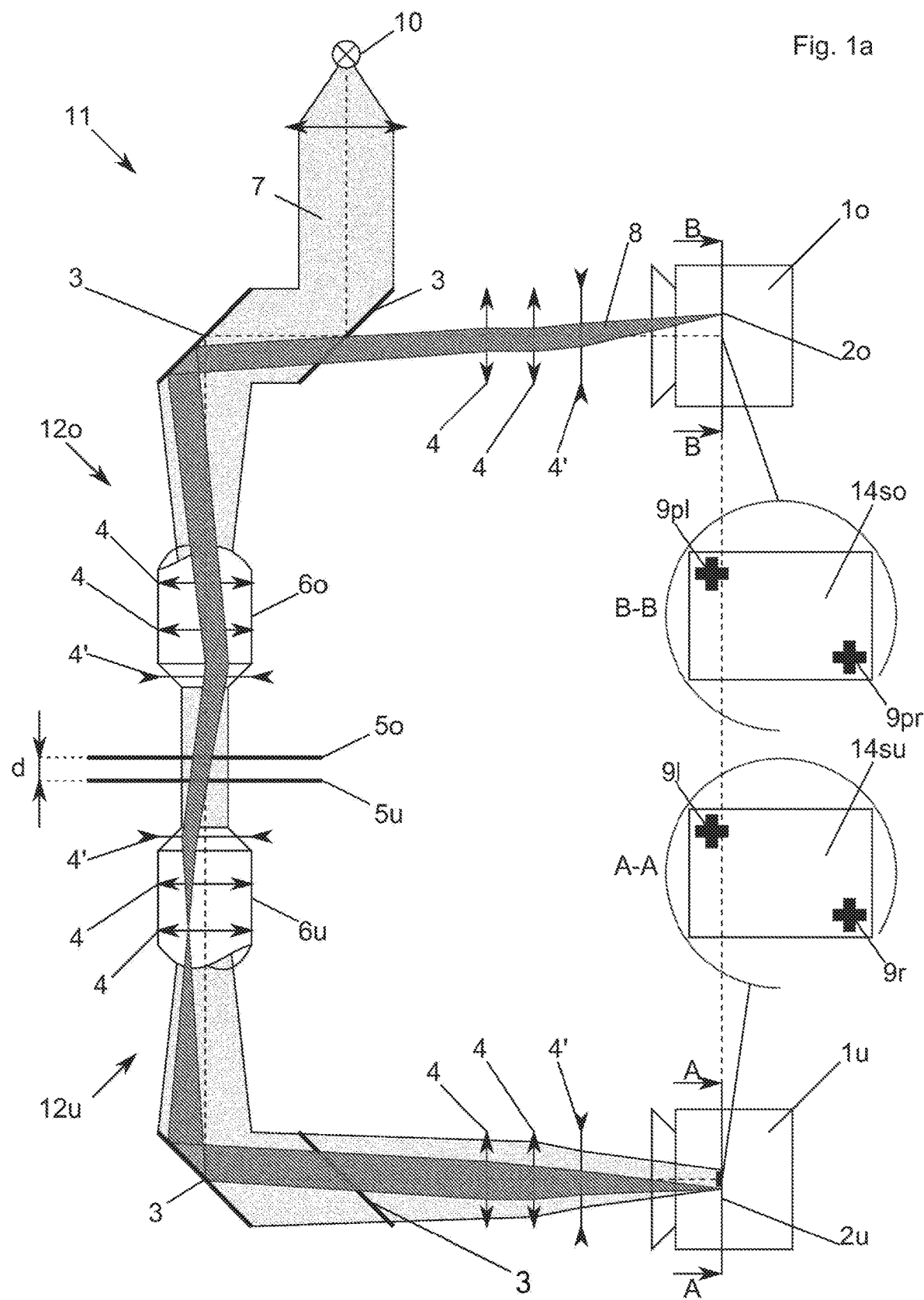
FIG. 1a shows a schematic, not to scale sketch of a first optical system according to the invention comprising a first light coupling.

FIG. 1a shows a schematic, not to scale sketch of a first optical system 11 according to the invention having two optical partial systems $12u$, $12o$ comprising two light paths 7, 8. The light path 7 represents an illuminating path for a lower camera chip $2u$ of a lower camera $1u$. The light path 8 is the imaging path of the alignment marks $9l$, $9r$.

The optical system 11 has a plurality of mirrors 3 and optical elements 4, 4', such as, e.g., mirrors, lenses, prisms etc. Light 7 is coupled into the optical system 11 by a light source 10. The light 7 passes through the optical system 11 comprising the mirrors 3 and optical elements 4, 4' and escapes from the optical system 11 again, whereby it hits a photosensitive surface $14su$ of the lower camera chip $2u$ of the lower camera, $1u$.

In this first embodiment according to the invention, the light of the illuminating path 7 is coupled into the optical system 11 via the source 10, in particular a lamp, more preferably a halogen lamp, and a mirror 3. The light of the illuminating path 7 penetrates two lenses $6o$, $6u$ and is projected onto the camera chip 2u of the lower camera 1u via further optical elements, in particular further mirrors 3.

It goes without saying that the coupling of the light into the optical system 11 is also conceivable by any other mirror 3 in the optical system 11, in particular when a camera chip 2o of an upper camera 1o is to be illuminated intensively. It is also conceivable to couple light into the optical system 11 via a plurality of sources 10 and a plurality of mirrors 3.

FIG. 1a also illustrates the imaging path 8, which displays the surface of the camera chip 2u or the surrounding area thereof, respectively, on the camera chip 2o via optical elements 4, 4', 3. In this concrete case, the camera chip 2u represents the object plane and the camera chip 2o the image plane of the entire optical system 11. Two alignment marks 9l, 9r can be seen in the sectional view A-A.

Figure 4A:
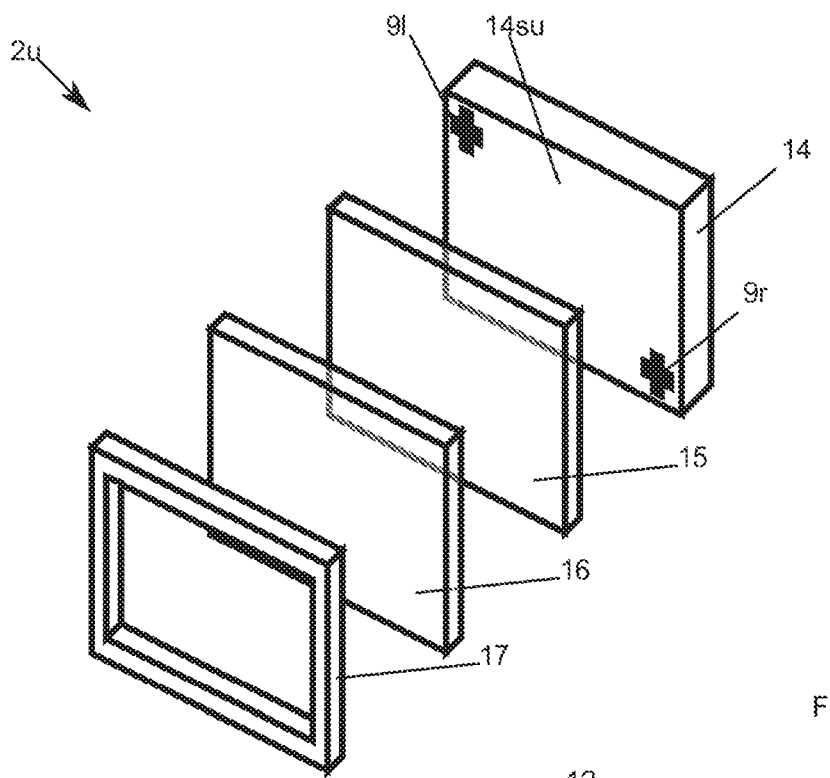
FIG. 4a shows a schematic, not to scale simplified isometric exploded sketch of a first camera chip according to the invention

In the first embodiment according to the invention, they are thus, e.g., alignment marks 9l, 9r according to FIG. 4a, which were attached directly to the photosensitive surface 14su of the lower camera chip 2u. The alignment marks 9l, 9r are then preferably an accumulation, which is in particular produced in cross form, of non-functional pixels. These pixels are not functional, because they have been coated, have not been connected, have been destroyed, have been inactivated, etc.

Figure 4B:
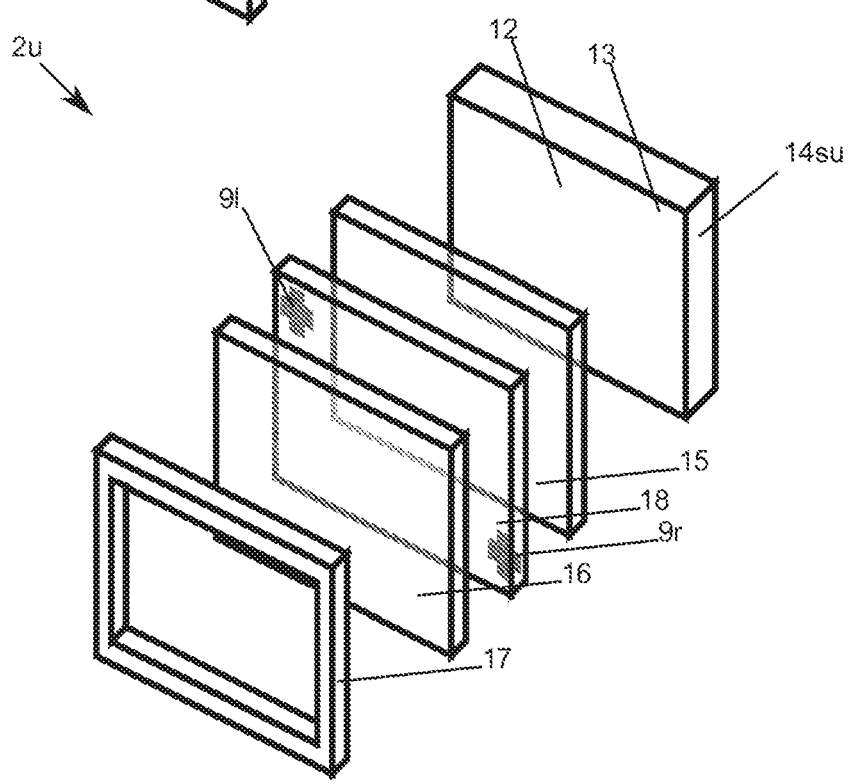
FIG. 4b shows a schematic, not to scale simplified isometric exploded sketch of a second camera chip according to the invention.

It is also conceivable that they are alignment marks 9l, 9r according to FIG. 4b. In this case, the alignment marks 9l, 9r are not located directly on the photosensitive surface 14su of the lower camera chip 2u, but at least in the vicinity thereof. In any event, the alignment marks 9l, 9r are actual physical entities.

The alignment marks 9l, 9r are now projected onto the upper camera chip 2o via the imaging path 8 and thus result in projected alignment marks 9pl, 9pr on the photosensitive surface 14so of the upper camera chip 2o. In FIG. 1a, the cameras 1u, 1o or the optical elements in the projection path 8, respectively, are already calibrated perfectly relative to one another, so that the projected alignment marks 9pl, 9pr in the section B-B appear to be focused at the correct, ideal positions. It can in particular be seen that the image plane 5u of the lower optical partial system 12u and the object plane 5o of the upper optical partial system 12o are at a distance d relative to one another. For the sake of clarity, the distance d was chosen to be sufficiently large to be able to clearly differentiate the image plane 5u as well as the object plane 5o from one another. To create focused projected alignment marks 9pl, 9pr, the image plane 5u as well as the object plane 5o need to be located in the depth of field of the respective other plane in each case.

FIG. 1b shows a schematic, not to scale sketch of a second optical system 11' according to the invention, having two optical partial systems 12u', 12o', comprising two light paths 7', 8. The light path 7' represents the illuminating path for the lower camera chip 2u of the lower camera 1u. In this embodiment according to the invention, the light of the illuminating path 7' is not coupled into the optical system 11' via a source 10, but simply from the surrounding area, in particular directly. It is thus scattered light, which is granted access to the optical system 11', in that corresponding shields of the optical system 11' are intentionally not obstructed, in particular on at least one location, more preferably on the camera 1u. It is also conceivable to couple the light into the optical system 11' from any other location in the optical system 11', in particular on the mirrors 3. It is also conceivable to couple in light at a plurality of locations of the optical system 11'. In the alternative, provision could be made in the surrounding area of the camera for an illumination, preferably with LEDs as light sources.

FIG. 1b also represents the imaging path 8, which images the surface of the camera chip 2u or the surrounding area thereof, respectively, on the camera chip 2o via optical elements 4, 4', 3. In this concrete case, the camera chip 2u represents the object plane and the camera chip 2o the image plane. As already described in FIG. 1a, the sections A-A and B-B show an optimal imaging situation.

Figure 1C:
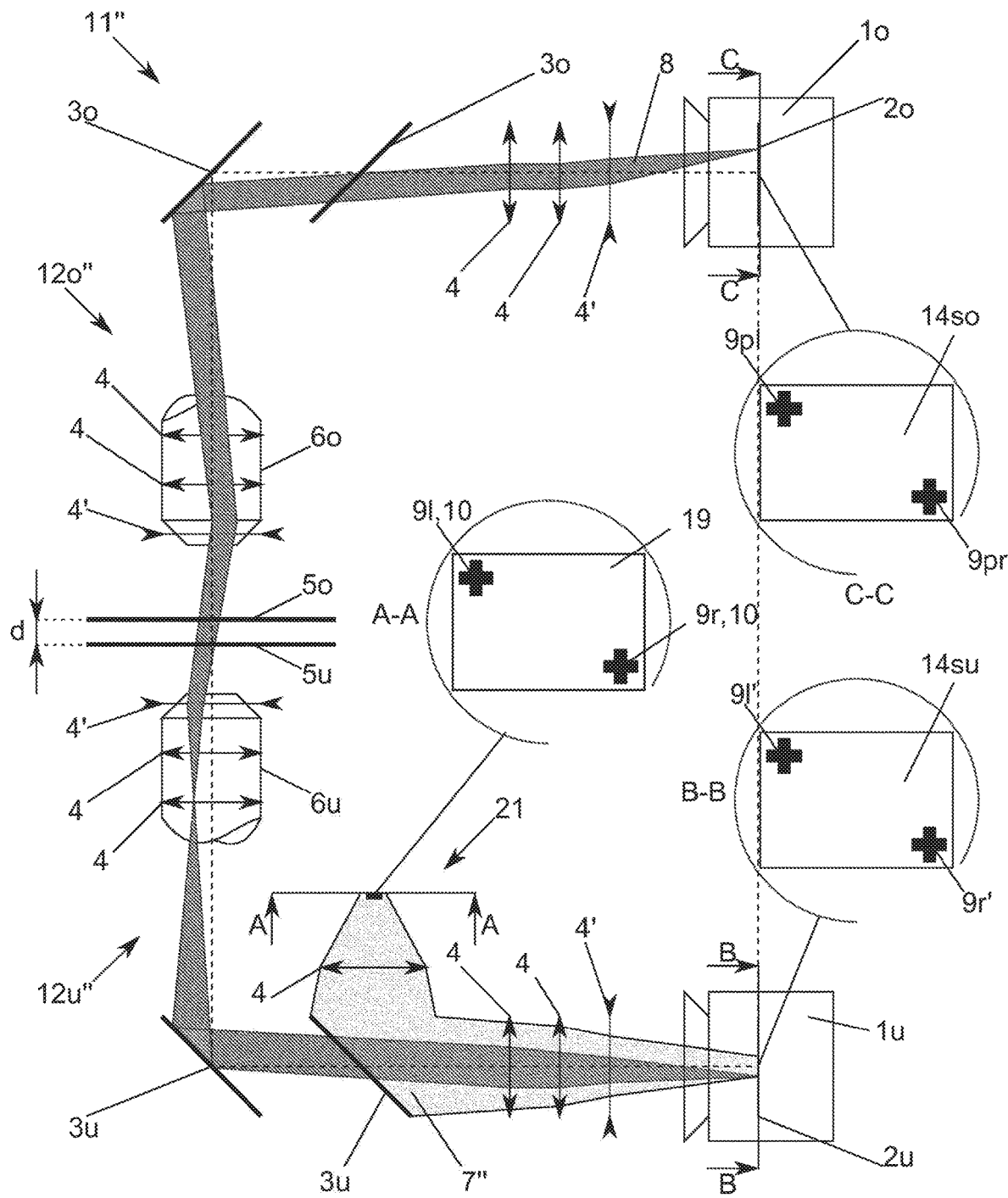
FIG. 1c shows a schematic, not to scale sketch of a third optical system according to the invention comprising a third light coupling.

FIG. 1c shows a schematic, not to scale sketch of an optical system 11", including two optical partial systems 12u", 12o", comprising two light paths 7", 8.

In a first embodiment according to the invention, the light path 7" is created by alignment marks 9l, 9r on a surface 19, wherein the alignment marks 9l, 9r simultaneously also act as light sources 10 (view A-A). It would be conceivable, for example, that the alignment marks 9l, 9r comprised of an, in particular cross-shaped LED field.

In a further, second embodiment according to the invention, the surface 19, on which the alignment marks 9l, 9r are located, emits light and the alignment marks 9l, 9r do not act as active light sources 10, but only as masks. The alignment marks 9l, 9r would then be projected as shadow marks across the illuminating path 7".

The embodiment according to the invention projects the alignment marks 9l, 9r of the surface 19 onto the camera chip 2u (view B-B). The photosensitive surface 14su of the camera chip 2u, in turn, represents the object plane for the camera 1o. The alignment marks 9l', 9r', which are projected by an alignment mark projection system 21, are thus projected as alignment marks 9pl, 9pr onto the photosensitive surface 14so of the upper camera chip 2o of the upper camera 1o via the optical system 11".

The difference to the embodiments according to FIGS. 1a and 1b is that none of the two camera chips 2u, 2o itself has to have alignment marks 9l, 9r, but that they are projected as projected alignment marks 9l' and 9r' onto the photosensitive surface 2u of the lower camera 1u via the alignment mark projection system 21 according to the invention, and are thus introduced into the optical system 11".

Figure 2A:
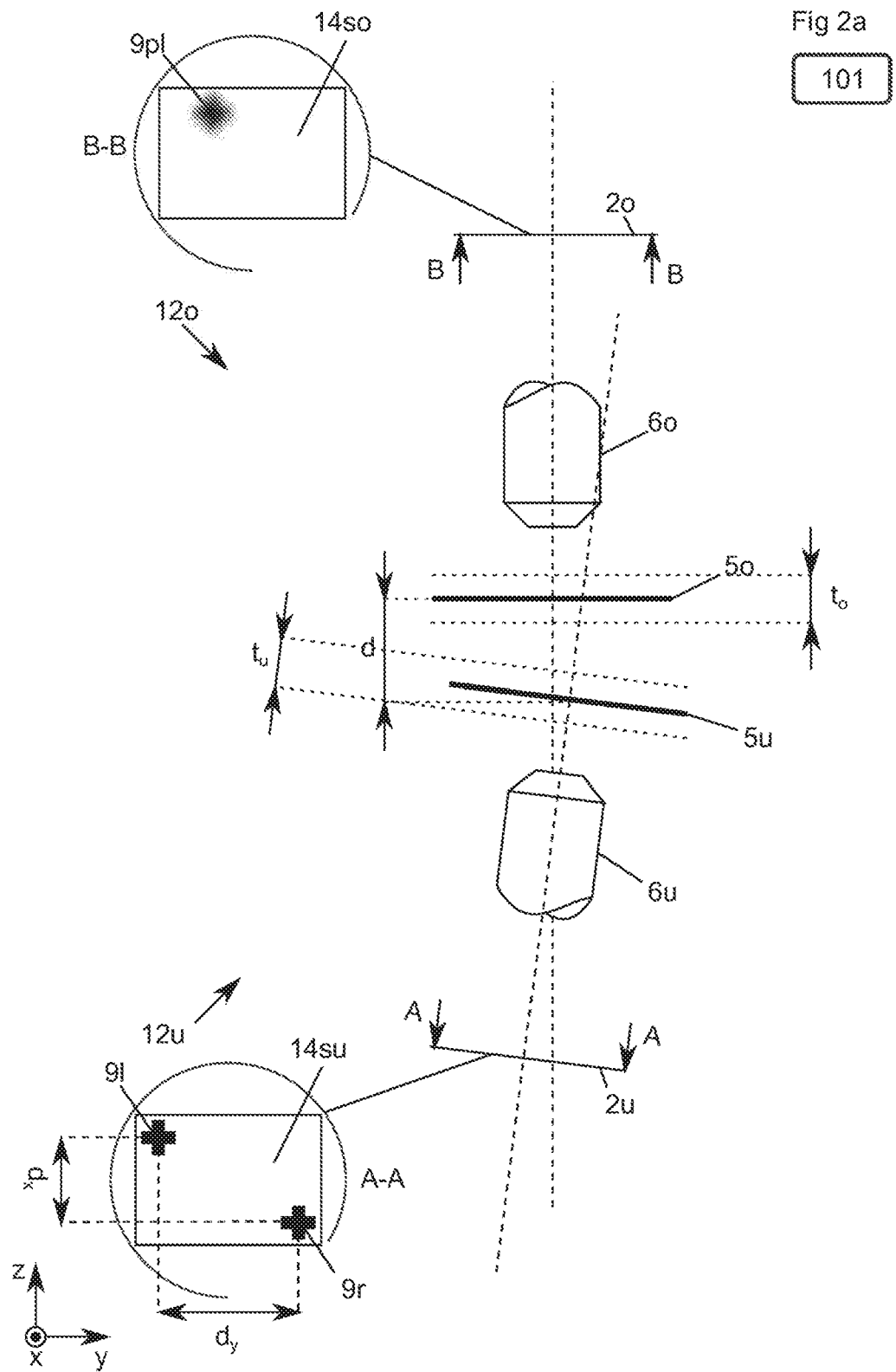
FIG. 2a shows a schematic, not to scale simplified sketch of a first process step according to the invention.

The illustrations in FIGS. 1a-1c are ideal to the effect that the optical elements 3, 3o, 3u, 4, 4', 6u, 6o, 1u, 1o have already been aligned perfectly relative to one another. The individual process steps, which need to be performed to reach this ideal state and to calibrate the optical system 11, 11', 11", are described in the further FIGS. 2a-2d as well as in FIGS. 3a, 3b. For the sake of clarity, in particular the illustration of the light paths, in particular of the illuminating path 7, 7' and of the imaging path 8, and the optical elements is largely forgone. FIGS. 2a-2d represent an optical system 11 according to FIG. 1a in an exemplary and representative manner. FIG. 2a shows a schematic, not to scale, simplified sketch of the optical system 11 according to the invention in a first process step 101 according to the invention, comprising the two optical partial systems 12u, 12o according to FIG. 1a. The characteristic feature of this illustration in particular is comprised of a distance d between the lower image plane (also referred to as optical plane) 5u of the lower lens 6u and the upper image plane 5o of the upper lens 6o.

The alignment marks 9l, 9r are located on the photosensitive surface 14su at a distance dx in the X direction relative to one another and at a distance dy in the Y direction.

The distance d between the optical planes 5u and 5o is so large that the upper optical plane 5o does not intersect the lower depth of field tu of the lower optical plane 5u or that the lower optical plane 5u does not intersect the upper depth of field to of the upper optical plane 5o, respectively. The optical plane 5u is the image plane of the lower optical partial system 12u.

The alignment marks 9l, 9r projected into the image plane 5u, however, must be projected onto the photosensitive surface 14so of the upper camera chip 2o via the upper optical partial system 12o. However, to be able to image the alignment marks 9l, 9r, which are projected into the image plane 5u of the lower optical system 12u, onto the photosensitive surface 14so in a focused manner, the optical plane 5u needs to be located in the depth of field to of the upper optical plane 5o, which simultaneously represents the object plane for the upper optical partial system 12o. If this is not the case, as shown in FIG. 2a, the projected alignment marks 9pl, 9pr are imaged on the photosensitive surface 14so so as to be out of focus (illustration B-B). The process step of FIG. 2a thus lies in bringing the two optical planes 5u and 5o closer towards one another.

Figure 2B:
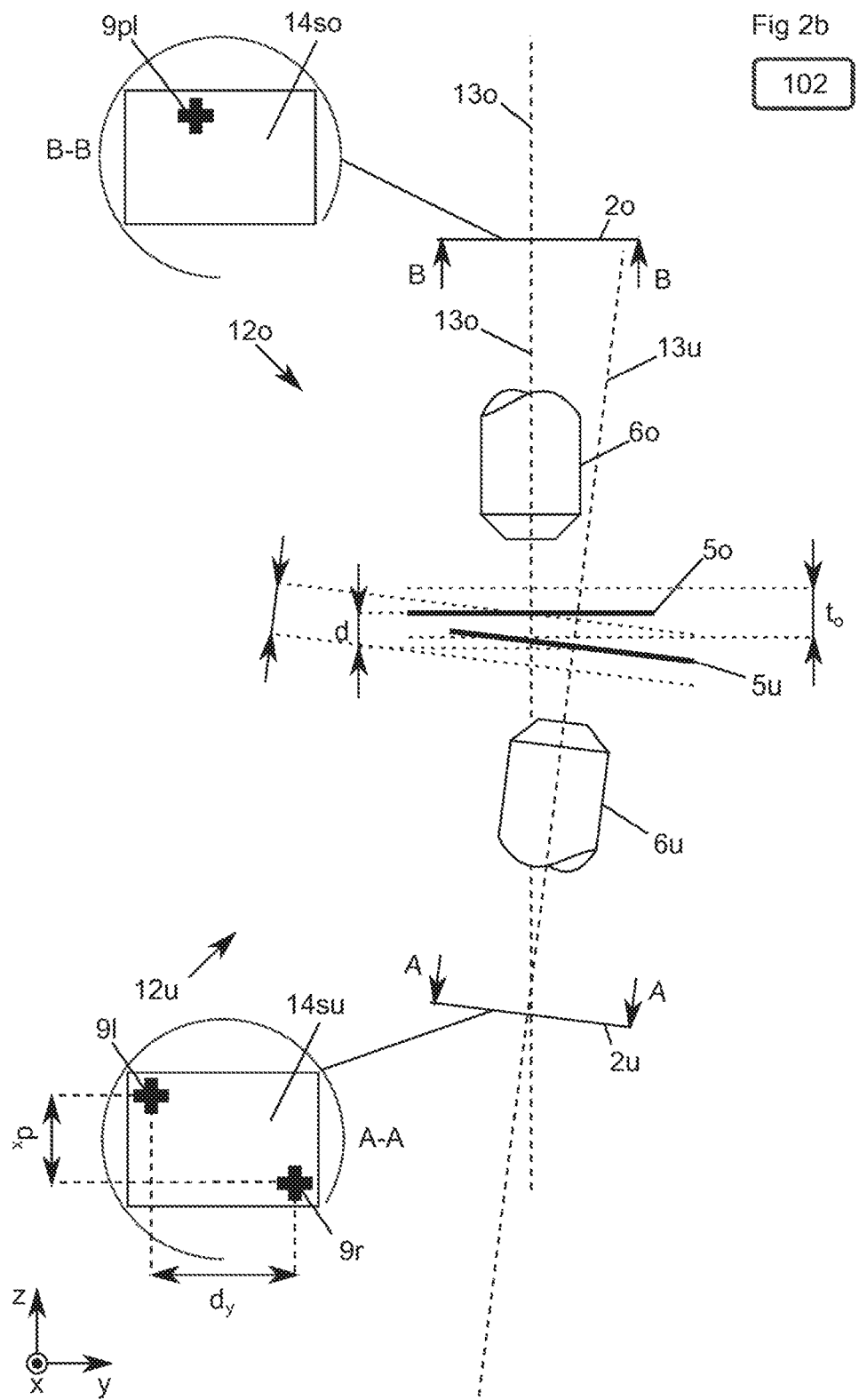
FIG. 2b shows a schematic, not to scale simplified sketch of a second process step according to the invention.

FIG. 2b shows a schematic, not to scale, simplified sketch of the optical system 11 in a second process step 102 according to the invention, comprising the two optical partial systems 12u, 12o, in the case of which the optical planes 5u and 5o were largely brought closer together, while the optical axes 13u and 13o of the lenses 6u and 6o are shifted relative to one another to such a large extent that they do not intersect one another between the lenses 6u, 6o.

This large deviation of the optical axes 13u, 13o has the result that only the alignment mark 9pl is located in the field of view of the upper camera 1u (illustration B-B). It is displayed so as to be focused, because the part of the optical plane 5u, onto which the alignment mark 9l is temporarily projected, is located in the depth of field to of the upper optical plane 5o.

The shift of the optical axes 13u and 13o towards one another results in a shift of the projected image with the alignment marks 9pl and 9pr on the upper photosensitive surface 14so of the upper camera chip 2o. This shift can be so strong that one of the alignment marks 9pl, 9pr is not visible, because it is not projected onto the photosensitive surface 14so. In the case at hand, this is the alignment mark 9pr. The process step of FIG. 2b is thus to bring the two alignment marks 9pl, 9pr into the field of view of the upper camera 1o.

Figure 2C:
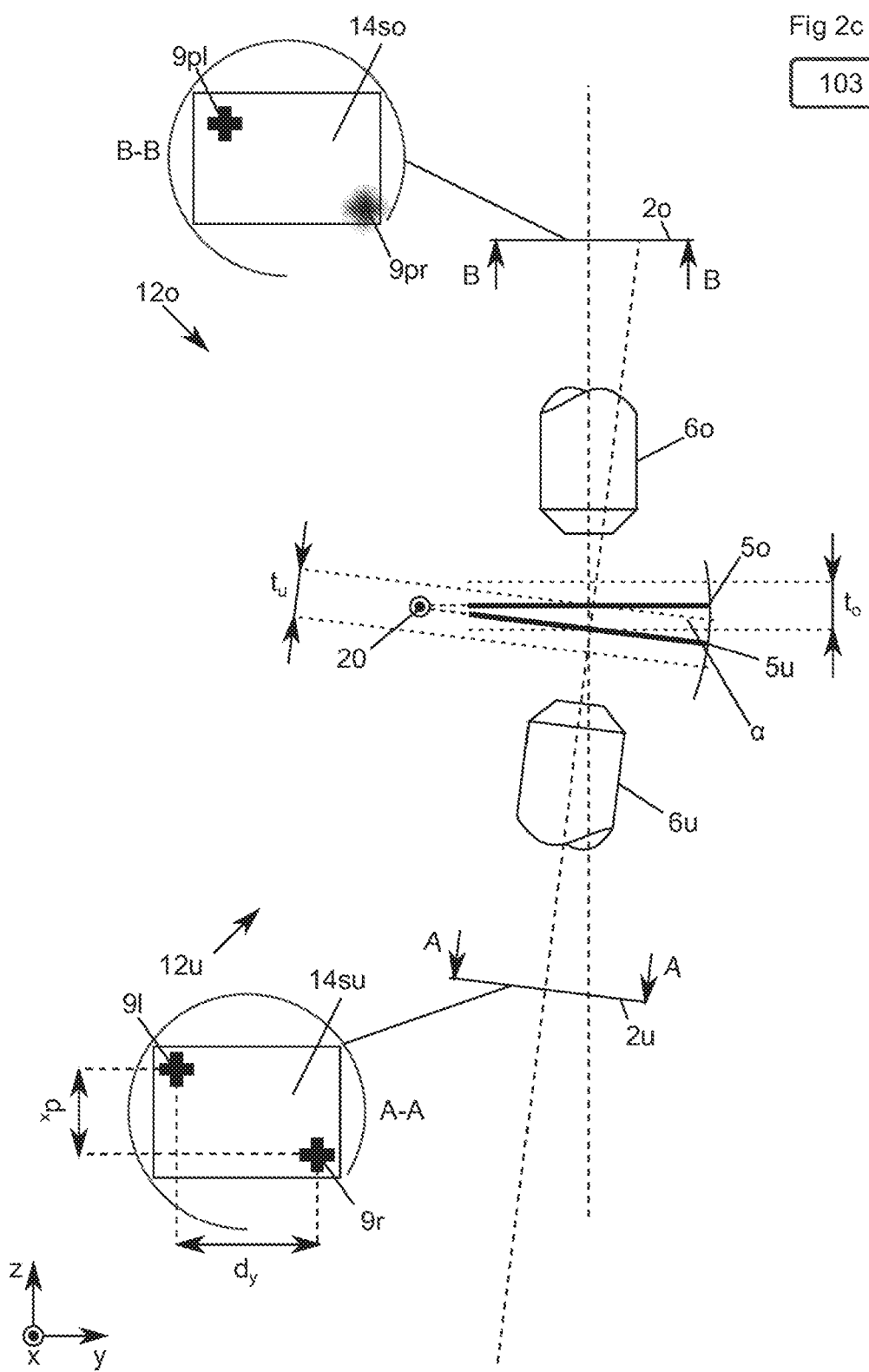
FIG. 2c shows a schematic, not to scale simplified sketch of a third process step according to the invention.

FIG. 2c shows a schematic, not to scale, simplified sketch of the optical system 11 in a third process step 103 according to the invention, comprised of the two optical partial systems 12u, 12o, in which the two projected alignment marks 9pl, 9pr are in the field of view of the upper camera 1o, but the two optical planes 5u and 5o are still inclined strongly relative to one another. A part of the lower optical plane 5u is thereby located in the upper depth of field to of the upper optical plane 5o, while the other part is located outside.

In an analogous observation to the description of FIG. 2b, it thus follows that the alignment mark 9l is imaged in a focused manner as alignment mark 9pl, while the alignment mark 9r is imaged so as to be out of focus as alignment mark 9pr. By means of a corresponding movement of the lower optical partial system 12u and/or of the upper optical partial system 12o, in particular of the lenses 6u, 6o, the optical planes 5u and 5o can be aligned relative to one another in such a way that the projected alignment marks 9pl and 9pr are both displayed in a focused manner.

From this statement, it can be derived mathematically, how the minimal wedge error, which can barely be measured by means of the method according to the invention, and which can thus be adjusted, can be calculated. For the sake of simplicity, it is assumed for the calculation that the two optical planes 5u, 5o are tilted only about a tilt axis 20, which is located parallel to the x axis to shall be the depth of field of the upper optical plane 5o and dx shall be the distance between the alignment marks 9l, 9r. Then $$\tan\alpha = \frac{t_o}{d_x}$$

The minimal correctable wedge error is thus $$\alpha = \arctan\frac{t_0}{d_x}$$

It can be seen that the correctable wedge error is smaller, the larger the distance dx between the alignment marks 9l, 9r, and the smaller the depth of width to of the upper optical plane 5o. The process step of FIG. 2c is thus to largely minimize the wedge error between the two optical planes 5u, 5o.

FIG. 2d shows a schematic, not to scale, simplified sketch of the optical system 11 in a fourth process step 104 according to the invention, comprised of the two optical partial systems 12u, 12o, in an optimal state, in which the optical plane 5u, which represents the image plane for the projected alignment marks 9l and 9r, is located in the depth of field to of the upper optical plane 5o, which simultaneously serves as object plane for the upper optical partial system 12o and thus the projected alignment marks 9pl and 9pr. The two planes 5u and 5o are preferably parallel to one another. In reality, the two planes, however, will always have a non-vanishing angle relative to one another. The angle between the two planes 5u and 5o is thereby smaller than 5°, preferably smaller than 1°, more preferably smaller than 0.1°, most preferably smaller than 0.01°, most preferably of all smaller than 0.001°. The person of skill in the art knows that the angle between two planes is identical to the angle between the two plane normals.

Due to the fact that the lower optical plane 5u is located in the depth of field to of the upper optical plane, the alignment marks 9l and 9r are displayed as focused alignment marks 9pl and 9pr (see illustration B-B).

The fine calibration of the alignment marks 9pl, 9pr relative to the desired, ideal positions 9il, 9ir (see FIG. 3b) now also occurs in this process step. The process step of FIG. 2d is thus to perform the fine calibration of the alignment marks 9pl, 9pr, in particular in the x and/or y direction.

Figure 3A:
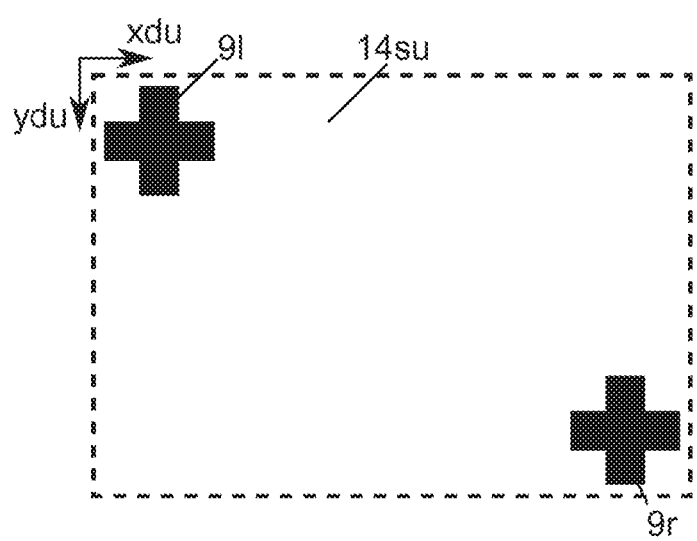
FIG. 3a shows a schematic, not to scale simplified, enlarged sketch of a lower sensitive surface.

FIG. 3a shows a schematic, not to scale, simplified, enlarged sketch of the photosensitive region 14su of the lower camera chip 2u. The corresponding alignment marks 9l, 9r can be seen. The position of the alignment marks 9l, 9r can best be specified in relation to a lower detector coordinate system (xdu, ydu). The origin of the lower detector coordinate system (xdu, ydu) is located in the left upper corner of the photosensitive surface 14su, for example.

Figure 3B:
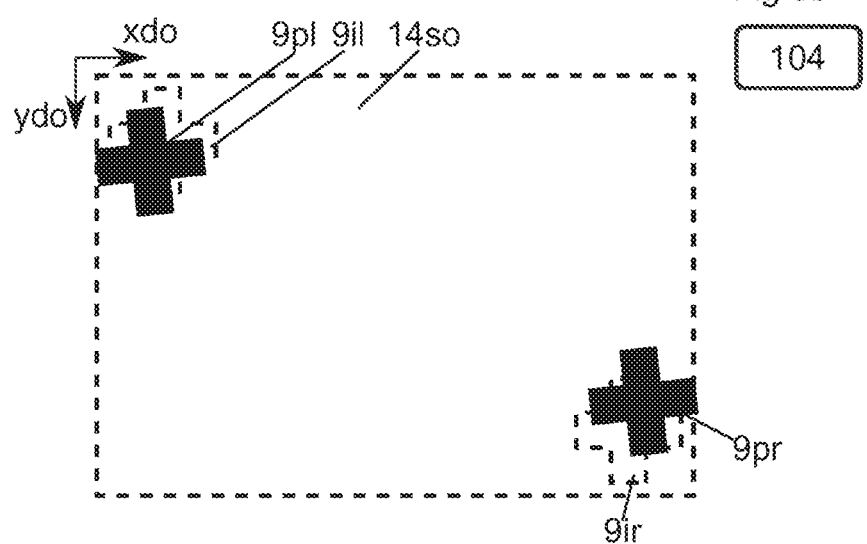
FIG. 3b shows a schematic, not to scale simplified, enlarged sketch of a fourth process step according to the invention in the initial state.

FIG. 3b shows a schematic, not to scale, simplified, enlarged sketch of the photosensitive region 14so of the upper camera chip 2o at the beginning of the fourth process step 104 according to the invention.

It can be seen that the projected alignment marks 9pl, 9pr are not congruent to the ideal positions 9il, 9ir. The upper photosensitive surface 14so has an upper detector coordinate system (xdo, ydo). The origin of the upper detector coordinate system (xdo, ydo) is located in the left upper corner of the photosensitive surface 14so.

The coordinates of the ideal positions 9il, 9ir in the detector coordinate system (xdo, ydo) preferably correspond to the coordinates of the alignment marks 9l, 9r in the lower detector coordinate system (xdu, ydu), if the photosensitive regions 14su, 14so have the same characteristics, such as length, width, resolution in the x direction, resolution in the y direction, etc., or, in short, if the same camera chips 2u, 2o are used. It noes without saying that a further condition is the correct and always the identical selection of the origin of the detector coordinate systems (xdu, ydu) and (xdo, ydo).

By means of a further adaptation of the optical elements in the optical systems 11, 11', 11", the alignment marks 9pl, 9pr can be calibrated in relation to the ideal positions 9il, 9ir. Translational shifts of the alignment marks 9pl, 9pr and/or a rotation in relation to the detector coordinate system (xdo, ydo) can thus occur.

If a perfect calibration is not possible completely and/or not economically wanted, because it would take too long, the alignment marks 9pl, 9il or 9pr, 9ir, respectively, will not be completely congruent with one another, but will be shifted translational and/or rotational relative to one another. The alignment process would then end at this step. According to the invention, the system stores the coordinates of the alignment marks 9pl, 9il, 9pr, 9ir in relation to the detector coordinate system (xdo, ydo). If the optical system calibrated in this way is used for example in a following process in such a way that the first alignment marks in a first substrate surface of a first substrate need to be aligned relative to one another with the second alignment marks of a second substrate surface of a second substrate, the measured and stored translational and/or rotational shifts need to then be used for the correction.

Figure 3C:
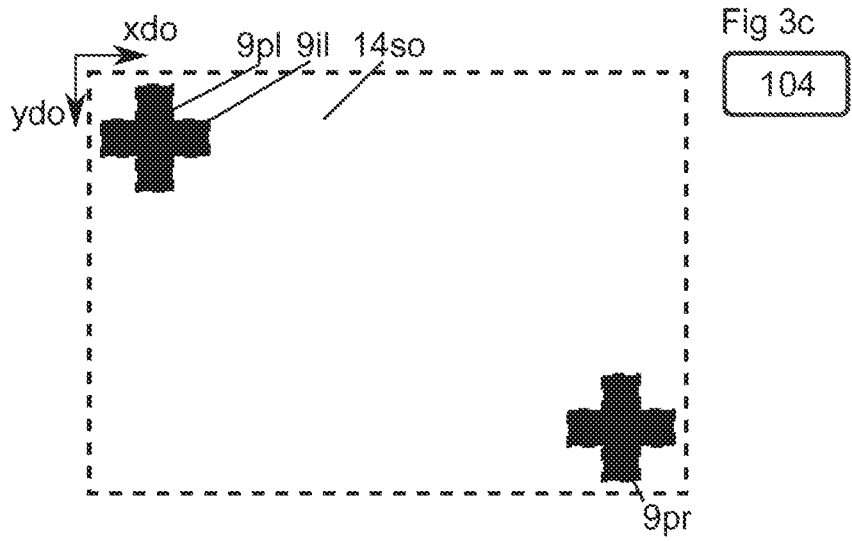
FIG. 3c shows a schematic, not to scale simplified, enlarged sketch of a fourth process step according to the invention in the final state.

FIG. 3c shows a schematic, not to scale, simplified, enlarged sketch of the photosensitive region 14so of the upper camera chip 2o at the end of the fourth process step 104 according to the invention. The alignment marks 9pl, 9pr are located at the ideal positions 9il, 9ir. The optical system 11, 11', 11" is thus calibrated. Even though it is the express and preferred goal of the process according to the invention to make the projected alignment marks 9pl, 9pr congruent with the ideal positions 9il, 9ir, the option is disclosed to not make the projected alignment marks 9pl, 9pr congruent with the ideal positions 9il, 9ir, and to instead store the rotational rotation and/or the translational shift between the projected alignment marks 9pl, 9pr and the ideal positions 9il, 9ir. With this stored information, a coordinate and/or image correction can be performed at any time. The performance of such a coordinate and/or image correction is associated with computing power. It is also conceivable that the alignment marks 9pl, 9pr cannot be made to be completely congruent with the ideal positions 9il, 9ir, in particular due to tolerances in the optical and/or mechanical components of the optical system 11, 11', 11". In this case, the rotational rotation and/or the translational shift are preferably also stored. A coordinate and/or image correction should preferably always be performed so as to obtain results, which are as exact as possible.

FIG. 4a shows a schematic, not to scale, isometric exploded view of a disassembled camera chip 2u according to a first embodiment according to the invention. The camera chip 2u comprises a chip carrier 14, which has a photosensitive surface 14su.

For the most part, the chip carrier 14 is sealed with a protective plate 15, in particular a glass plate. The seal can thereby only be broken with enormous force and routinely leads to the destruction of the chip carrier 14, in particular of the photosensitive surface 14su. The alignment marks 9l, 9r would thus need to preferably be produced by the chip manufacturer prior to the sealing with the protective plate 15.

Further glass plates 16, in particular optical filters, can be mounted and fastened to the protective plate 15. For the most part, all components 14, 15, 16 are fixed by means of a frame 17.

FIG. 4b shows a schematic, not to scale, isometric exploded view of a disassembled camera chip 2u according to another embodiment according to the invention, in the case of which a separate marking plate 18 according to the invention, comprising alignment marks 9l, 9r is fixed in particular directly after the protective plate 15, thus as close as possible on the photosensitive surface 14su. The alignment marks 9l, 9r are preferably located on the side of the marking plate 18, which faces the photosensitive surface 1.4su, in order to even further reduce the distance between the alignment marks 9l, 9r and the photosensitive surface 14su.

In the case of most camera chips 2u, the insertion of the marking plate 18 can be performed relatively easily, because all components above the protective plate 15 can be removed easily, in particular even intentionally. Such camera chips 2u can thus be expanded, in particular by means of filters, in the specific case by means of a marking plate 18.

REFERENCE LIST 1o, 1u camera
2o, 2u camera chip
3, 3o, 3u mirror
4, 4' lenses
5o, 5u optical plane, in particular object or image plane
6o, 6u lens
7, 7', 7" illuminating path
8 imaging path
9l, 9r, 9l', 9r' alignment mark
9pl, 9pr projected alignment mark
9il, 9ir ideal alignment marks
10 source
11, 11', 11" optical system
12u, 12u', 12u" optical partial system
12o, 12o', 12o" optical partial system
13u, 13o optical axis
14 chip carrier
14so, 14su photosensitive surface
15 protective plate
16 glass plate, in particular filter
17 frame
18 marking plate
19 surface
20 tilt axis
21 alignment mark projection system
α angle between optical planes
A-A sectional illustration
B-B sectional illustration
d distance
dx, dy distance
tu, to depth of field
xdu, ydu coordinates

What is claimed is:

1. A method for aligning first and second optical partial systems of an optical system, which are arranged so as to be located opposite to one another, said method comprising:

projecting alignment marks from a first camera chip of the first optical partial system into a first image plane of the first optical partial system, projecting the alignment marks from the first image plane of the first optical partial system onto a photosensitive surface of a second camera chip of the second optical partial system, and aligning the first and second optical partial systems relative to one another, such that projections of the alignment marks in a depth of field of the photosensitive surface of the second camera chip are imaged at ideal positions.

2. The method according to claim 1, wherein the alignment marks are attached directly to a photosensitive surface of the first camera chip.

3. The method according to claim 1, wherein the alignment marks are attached to a separate marking plate in the first camera chip, wherein the distance between the alignment marks attached to the separate marking plate and a photosensitive surface of the first camera chip is smaller than 1 mm.

4. The method according to claim 1, wherein the method includes illuminating the alignment marks with light that is coupled into the first and/or second optical partial system via at least one light source.

5. The method according to claim 4, wherein the at least one light source is a lamp.

6. The method according to claim 1, wherein the method includes illuminating the alignment marks with ambient light that is coupled in at least one location of the first and second optical partial systems.

7. The method according to claim 6, wherein said at least one location is on the first camera chip and/or on a mirror.

8. The method according to claim 6, wherein a shielding of the first and second optical partial systems is not installed.

9. The method according to claim 1, wherein the alignment marks are projected onto a photosensitive surface of the first camera chip by use of an alignment mark projection system.

10. The method according to claim 9, wherein the alignment marks comprise an LED field and/or are embodied as masks.

11. The method according to claim 1, wherein the alignment marks are attached directly to a photosensitive surface of the first camera chip, wherein the alignments marks have an accumulation of non-functional pixels.

12. (previously presented The method according to claim 11, wherein the alignment marks have a cross shape.

13. The method according to claim 1, wherein the first optical partial system comprises a first lens and the second optical partial system comprises a second lens, said first and second lenses located opposite to one another, and image planes and/or optical axes of the first and second lenses are aligned relative to one another.

14. The method according to claim 13, wherein the method further comprises:
(a) arranging the alignment marks on a carrier located at a distance from a photosensitive surface of the first camera chip and/or arranging alignment marks on a photosensitive surface of the first camera chip, and/or
(b) projecting the alignment marks onto a photosensitive surface of the first camera chip, wherein the first image plane is arranged between the first lens of the first optical partial system and the second lens of the second optical partial system.

15. The method according to claim 13, wherein the first and second lenses for the alignment are moved in a translational and/or rotational manner relative to one another.

16. The method according to claim 13, wherein the first and second lenses for the alignment are approached such that the image plane of the first lens is located in a depth of field of an object plane of the second lens.

17. The method according to claim 13, wherein at least the first and second lenses are part of a system for aligning substrates.

18. The method according to claim 17, wherein the substrates are wafers.

19. An optical system for aligning first and second optical partial systems of the optical system, which are located opposite to one another, said optical system comprising:

a first camera comprising a first camera chip for projecting alignment marks in a first image plane of the first optical partial system, means for projecting the alignment marks from the first image plane onto a photosensitive surface of a second camera chip of the second optical partial system, means for aligning the first and second optical partial systems relative to one another, such that projections of the alignment marks are imaged at ideal positions in a depth of field of the photosensitive surface of the second optical partial system.

20. The optical system according to claim 19, wherein the first and second optical partial systems are located on top of one another.

21. A camera chip comprising the alignment marks for the optical system according to claim 13, wherein the alignment marks are located
(a) on a carrier located at a distance from a first photosensitive surface of the first camera chip and/or
(b) on a photosensitive surface of the first camera chip.

22. The optical system according to claim 19, wherein the system includes an alignment mark projection system for projecting the alignment marks onto a photosensitive surface of the first camera chip.

23. The optical system according to claim 22, wherein the alignment marks comprise an LED field and/or are embodied as masks.

* * * * *